United States Patent
Kim et al.

(10) Patent No.: US 7,715,230 B2
(45) Date of Patent: May 11, 2010

(54) METHOD OF OPERATING A FLASH MEMORY DEVICE

(75) Inventors: Jum Soo Kim, Icheon-si (KR); Tae Gyun Kim, Seoul (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 142 days.

(21) Appl. No.: 12/146,927

(22) Filed: Jun. 26, 2008

(65) Prior Publication Data

US 2009/0129168 A1      May 21, 2009

(30) Foreign Application Priority Data

Nov. 21, 2007   (KR) .................... 10-2007-0119034

(51) Int. Cl.
  *G11C 16/04*   (2006.01)
(52) U.S. Cl. .............................. 365/185.03; 365/185.18
(58) Field of Classification Search ............ 365/185.03, 365/185.18, 185.22, 185.17
  See application file for complete search history.

(56) References Cited

U.S. PATENT DOCUMENTS

2008/0056006 A1*   3/2008   Jung et al. ............. 365/185.22
2009/0003056 A1*   1/2009   Chun et al. ............ 365/185.03

FOREIGN PATENT DOCUMENTS

KR   10-2007-0109172       11/2007

OTHER PUBLICATIONS

Office Action dated Aug. 27, 2009, for Korean application No. 10-2007-0119034.

* cited by examiner

*Primary Examiner*—Vu A Le
(74) *Attorney, Agent, or Firm*—Lowe Hauptman Ham & Berner, LLP

(57) ABSTRACT

A method of operating a flash memory device wherein the width of threshold voltage distribution of memory cells is adjusted by setting different conditions of a program operation in accordance with levels of threshold voltages of the memory cells. As a result, width of the threshold voltage distribution of memory cells may be narrowed.

26 Claims, 3 Drawing Sheets

METHOD OF OPERATING A FLASH MEMORY DEVICE

CROSS-REFERENCE TO RELATED APPLICATIONS

This application claims priority from Korean Patent Application No. 10-2007-0119034, filed on Nov. 21, 2007, the contents of which are incorporated herein by reference in its entirety.

BACKGROUND OF THE INVENTION

The present invention relates to a method of operating a flash memory device. More particularly, the present invention relates to a method of operating a flash memory device for narrowing threshold voltage distribution of memory cells.

A flash memory device is a representative non-volatile memory device in which data are not erased though supply of a power source is stopped.

A flash memory device is divided into an NOR flash memory device and an NAND flash memory device in accordance with structure of a memory cell array.

The NAND flash memory device has been widely used because the NAND flash memory device has high integration density characteristics compared to the NOR flash memory device.

Recently, a technique for storing at least two bit data in one memory cell in the NAND flash memory device has been developed.

In case that a memory cell stores one bit data, the memory cell has two threshold voltage levels, i.e., a level smaller than 0V and a level higher than 0V.

However, in case that a memory cell stores 2 bit data, the memory cell has four threshold voltage levels, i.e., one level smaller than 0V and three levels higher than 0V. Here, since the memory cell has three threshold voltage levels higher than 0V, the margins for separating the threshold voltage levels may not be adequate when threshold voltage distribution width is wide. Hence, the threshold voltage distributions having different levels may be overlapped.

In this case, since data stored in the memory cell are not separated, an error may occur in the memory cell. Accordingly, the memory cell should have narrow threshold voltage distributions. Here, since three threshold voltage distributions exist in a given range, the threshold voltage distributions should be configured to have considerable small widths. However, due to characteristics of a program operation of the flash memory device, the potential for narrowing the width of the threshold voltage distributions is limited.

SUMMARY OF THE INVENTION

It is a feature of the present invention to provide a method of operating a flash memory device for adjusting the width of threshold voltage distribution of memory cells by setting different conditions for a program operation in accordance with levels of threshold voltages of the memory cells, when the program operation is performed. As a result, width of the threshold voltage distribution of programmed memory cells may be narrowed.

A method of operating a flash memory device according to one exemplary embodiment of the present invention includes performing a first program operation on memory cells; performing a verifying operation for dividing the memory cells in accordance with levels of threshold voltages of the memory cells; to and performing a second program operation on the memory cells so that the threshold voltages of the memory cells are increased in inversely proportional to the threshold voltage levels thereof.

A threshold voltage of a memory cell having the threshold voltage higher than a target voltage is not increased in the second program operation.

A method of operating a flash memory device according to another exemplary embodiment of the present invention includes performing a first program operation on memory cells; performing a verifying operation that separates the memory cells into first memory cells, second memory cells, third memory cells and fourth memory cells, wherein threshold voltages of the first memory cells are higher than a target voltage, threshold voltages of the second memory cells are lower than the target voltage and higher than a first comparing voltage, threshold voltages of the third memory cells are lower than the first comparing voltage and higher than a second comparing voltage, and threshold voltages of the fourth memory cells are lower than the second comparing voltage; and performing a second program operation on the second memory cell, the third memory cell and the fourth memory cell, so that the threshold voltages of the second memory cell, the third memory cell and the fourth memory cell are increased inversely proportional to the threshold voltage levels thereof.

A method of operating a flash memory device according to still another example embodiment of the present invention includes performing a first program operation on memory cells; performing a verifying operation for dividing the memory cells into first memory cells, second memory cells, third memory cells and fourth memory cells, wherein threshold voltages of the first memory cells are higher than a target voltage, threshold voltages of the second memory cells are lower than the target voltage and higher than a first comparing voltage, threshold voltages of the third memory cells are lower than the first comparing voltage and higher than a second comparing voltage, and threshold voltages of the fourth memory cells are lower than the second comparing voltage; and performing a second program operation by applying a first bit line voltage to a fourth bit line voltage to a first bit line to a fourth bit line connected electrically to the first memory cells to the fourth memory cells.

The threshold voltage of the memory cell having the threshold voltage higher than the target voltage is not increased in the second program operation.

A second program voltage higher than a first program voltage applied in the first program operation is provided in the second program operation.

The program voltage is increased to be in the range of approximately 14V to approximately 22V.

The program voltage is increased by about 0.1V to about 2.0V.

A difference of the first comparing voltage and the target voltage is about 0.2V to about 0.5V.

The second comparing voltage is set as intermediate level of the first comparing voltage and the target voltage.

The first bit line voltage to the fourth bit line voltages are applied to the first bit line to the fourth bit line in inversely levels of the threshold voltages of the first to fourth memory cells.

The third bit line voltage is in an intermediate level between the second bit line voltage and the fourth bit line voltage.

A program prohibition voltage is applied to a bit line connected electrically to the first memory cell in the second program operation so that program of the first memory cell is not performed.

The verifying operation and the second program operation are repeatedly performed, step increasing a program voltage until the threshold voltages of every memory cell are higher than the target voltage.

As described above, a flash memory device of the present invention narrows a width of threshold voltage distribution of memory cells.

As a result, margins between the threshold voltage distributions of the memory cells for storing different data may widen.

In addition, the data stored in the memory cells may be accurately separated because the margins are widen.

Moreover, error may be prevented in a read operation because the margins are widen.

Furthermore, since a change value of the threshold voltages is adjusted in accordance with level of the threshold voltages, a time for the program operation may be minimized.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings.

Figure 1:
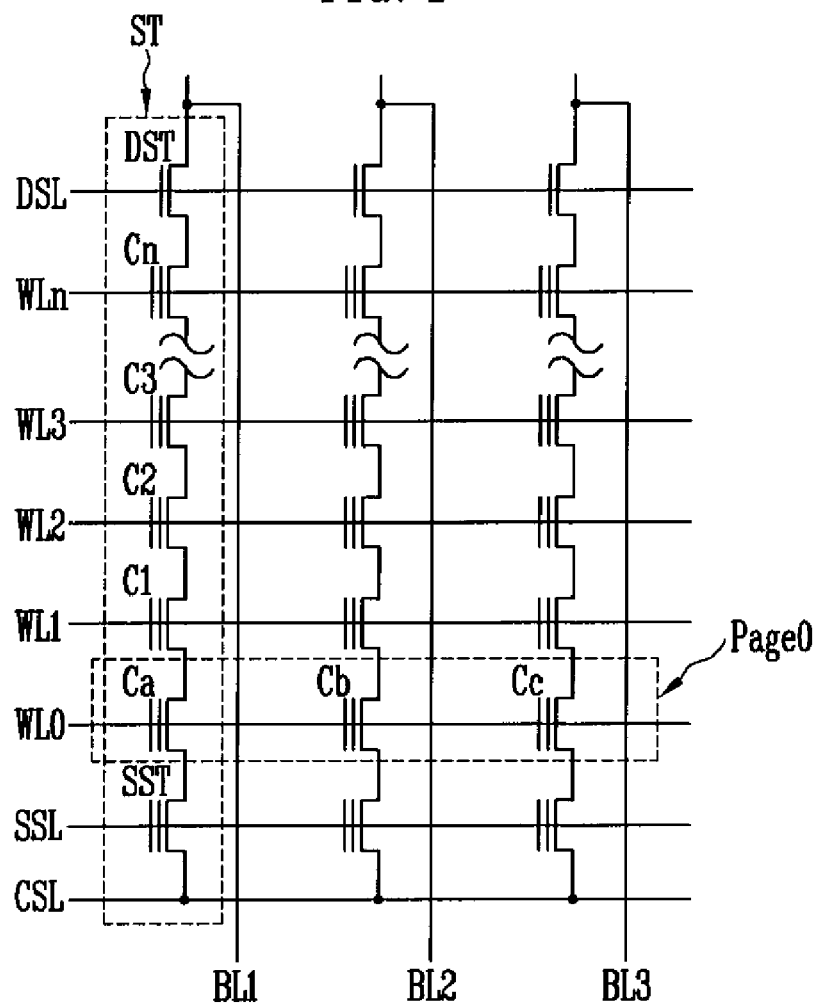
FIG. 1 is a view illustrating a memory cell block for describing a method of operating a flash memory device according to one exemplary embodiment of the present invention.

FIG. 1 is a view illustrating a memory cell block for describing a method of operating a flash memory device according to one example embodiment of the present invention.

In FIG. 1, a memory cell array in an NAND-flash memory device has a plurality of memory cell blocks, wherein FIG. 1 shows only one memory cell block.

Each of the memory cell blocks has cell strings ST.

Each of the cell strings ST is coupled to corresponding bit line, wherein FIG. 1 shows only three bit lines BL1 to BL3 for convenience.

Each of the cell strings ST includes a drain select transistor DST, memory cells Ca, C1 to Cn (n is an integer) and a source select transistor SST coupled in serial. Here, a drain of the drain select transistor DST is coupled to corresponding bit line, and a source of the source select transistor SST is coupled to a common source line CSL. In addition, gates of the drain select transistors DST are coupled to a drain select line DSL, and gates of the source select transistor SST are coupled to a source select line SSL.

Gates of the memory cells are coupled to corresponding word lines WL0 to WLn. Here, the memory cells Ca, Cb and Cc sharing one word line, e.g. WL0 form one page Page0.

In the NAND flash memory device, a program operation of storing data in a specific memory cell is performed in a unit of the page. That is, different data is simultaneously stored in the memory cells Ca, Cb and Cc included in the one page Page0.

The program operation is performed by using an incremental step pulse programming (ISPP) method.

Particularly, a threshold voltage of the memory cell is increased when the program operation is performed. Then, a determination is made whether or not the threshold voltage of the memory cell is increased up to a target voltage.

In case that the threshold voltage of the memory cell is smaller than the target voltage, a program voltage applied to the word line WL0 is increased by a given level in accordance with the ISPP, and then the program operation is again performed by using the increased program voltage.

In the above ISPP method, the program operation is repeatedly performed, increasing the program voltage until the threshold voltage of the memory cell reaches a voltage more than the target voltage.

The memory cells Ca to Cc sharing the word line WL0 are included in the page Page0, wherein program velocities of the memory cells Ca to Cc are different.

Particularly, in case that the program operation is performed by applying a program pulse, a first memory cell and a second memory cell may be included in a corresponding page, wherein a threshold voltage of the first memory cell is considerable changed due to rapid program velocity, and a threshold voltage of the second memory cell is a little changed due to slow program velocity. Accordingly, though the threshold voltages of the memory cells are increased to a voltage greater than the target voltage, the threshold voltage of the first memory cell may be much greater than the target voltage, and the threshold voltage of the second memory cell may be a little higher than the target voltage. As a result, the width of threshold voltage distributions of the programmed memory cells may widen.

The flash memory device of the present embodiment adjusts program velocity of the memory cells, i.e., changes the value of the threshold voltage by setting differently condition of the program operation in accordance with a difference of the threshold voltage and the target voltage, and so a width of threshold voltage distributions of the programmed memory cells may be narrowed. This will be described in detail with reference to accompanying drawings.

FIG. 2A to FIG. 2D are views illustrating change of threshold voltage of the memory cells in accordance with an operation of a flash memory device according to one example embodiment of the present invention. FIG. 3 is a view illustrating a circuitry for the operation of the flash memory device according to one exemplary embodiment of the present invention.

Figure 2A:
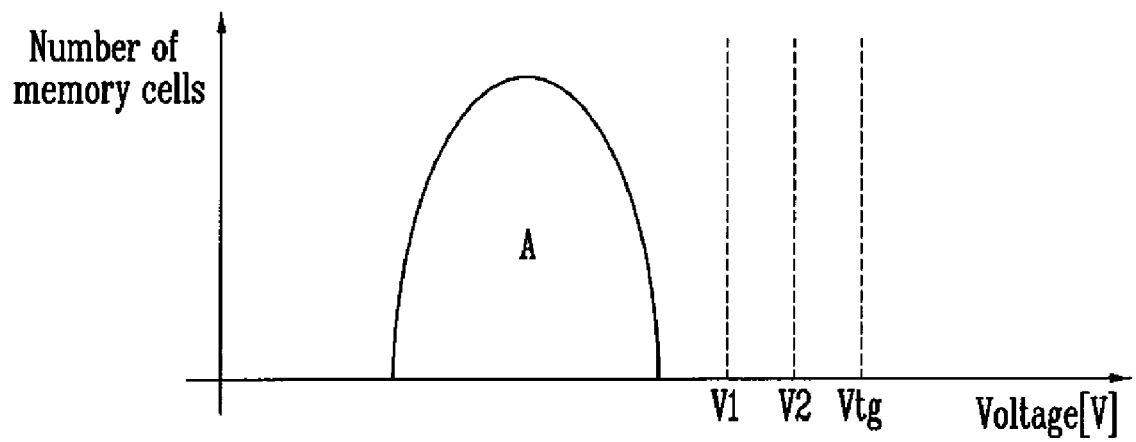
FIG. 2A to FIG. 2D are views illustrating change of threshold voltage of the memory cells in accordance with an operation of a flash memory device according to one exemplary embodiment of the present invention.
Figure 3:
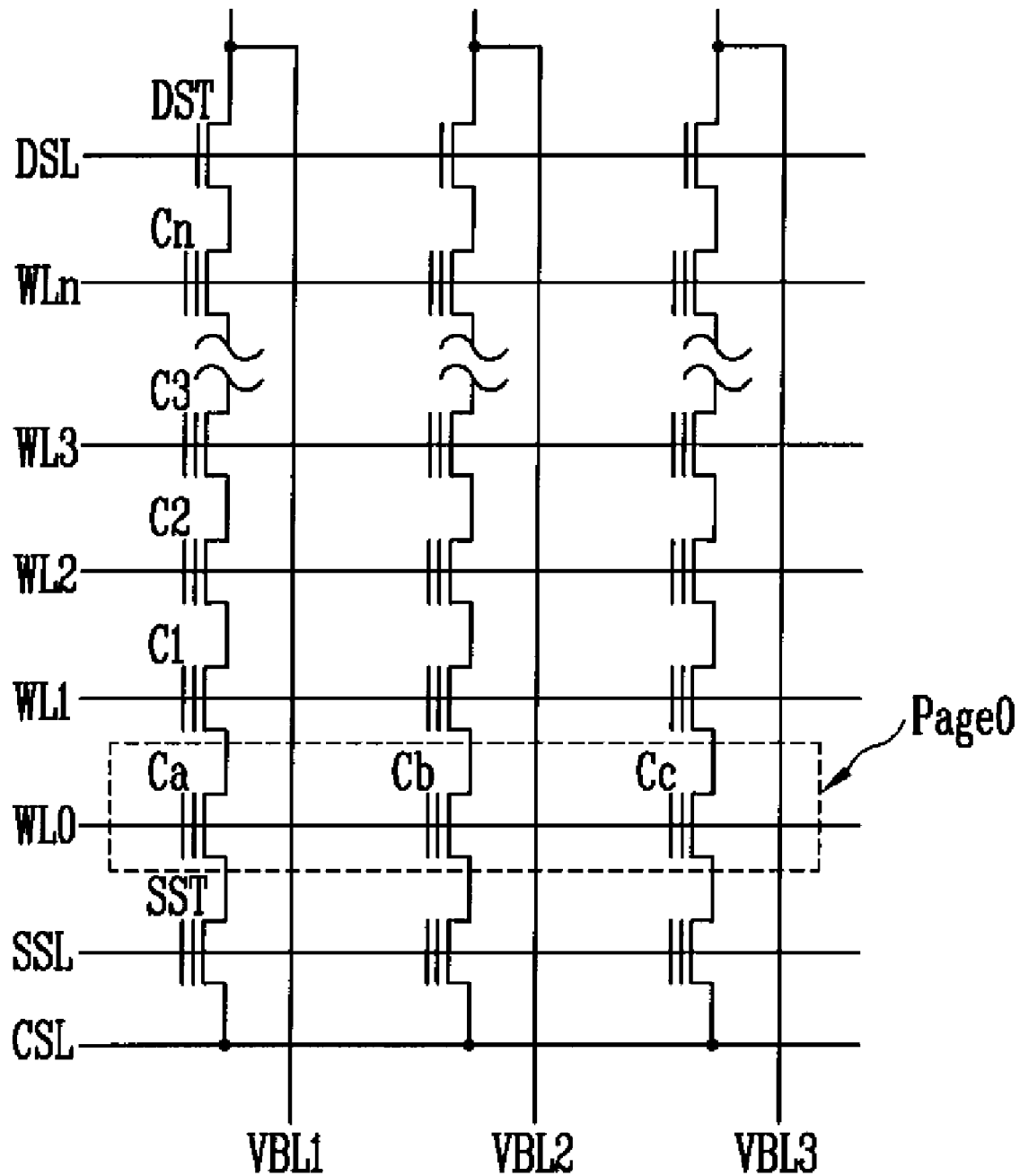
FIG. 3 is a view illustrating a circuitry for the operation of the flash memory device according to one exemplary embodiment of the present invention.

In FIG. 2A, memory cells in a memory cell block are erased in accordance with an erase operation before a program operation is performed, and so threshold voltages of the memory cells form one threshold voltage distribution A. Here, threshold voltage distributions of the memory cells may have various levels in case of storing upper bit data in one memory cell in the program operation for storing 2 bit data, which is not shown.

A program operation described below may be applied to an LSB program operation for storing lower bit data or an MSB program operation for storing the upper bit data.

The program operation is performed through an ISPP method, and the threshold voltage of the memory cell should be increased up to a voltage greater than a target voltage Vtg. In the program operation, a first comparing voltage V1 and a second comparing voltage V2 smaller than the target voltage Vtg are set. Here, the first comparing voltage V1 is smaller than the second to comparing voltage V2, and voltage difference of the first comparing voltage V1 and the target voltage Vtg is set as 0.2V to 0.5V. Voltage difference of the second comparing voltage V2 and the target voltage Vtg may correspond to half of the voltage difference of the first comparing voltage V1 and the target voltage Vtg. In other words, the voltage difference of the second comparing voltage V2 and the target voltage Vtg is 0.1V to 0.25V.

Figure 2B:
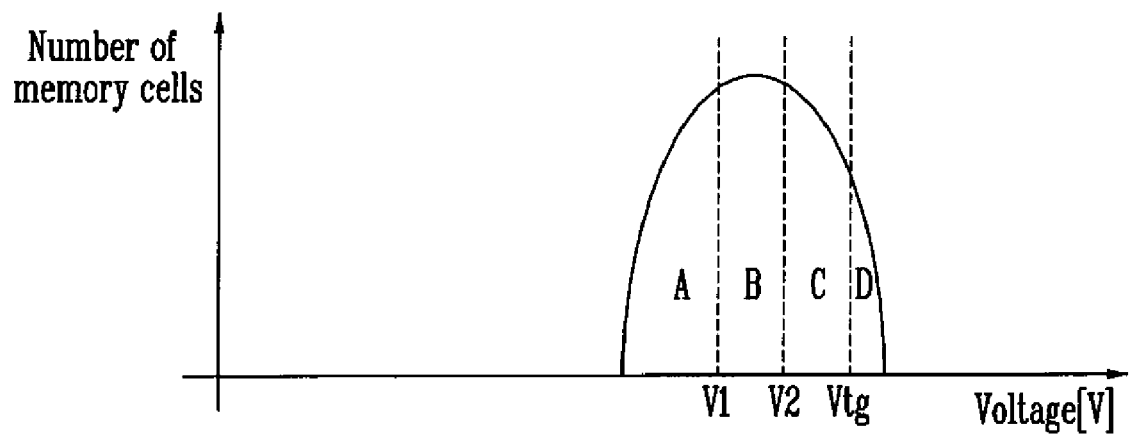

Referring to FIG. 2B and FIG. 3, a first program operation is performed on memory cells Ca to Cc sharing a selected word line, e.g. WL0. Here, a memory cell, its threshold voltage is maintained without programmed in accordance with stored data, may be existed. However, it is assumed that every memory cell Ca to Cc sharing the selected word line WL0 is programmed.

Every memory cell Ca to Cc should be programmed in a first program operation performed at first of the program operation through an ISPP method, and thus bit line voltages VBL1 to VBL3 of 0V are applied to corresponding bit lines, and a first program voltage is provided to the selected word line WL0. As a result, voltage difference is generated between the word line WL0 and bulk of the memory cells, e.g., semiconductor substrate or P-well.

In this case, electrons are injected from the bulk to floating gates of the memory cells in accordance with the voltage difference and are stored in the memory cells. As a result, the threshold voltages of the memory cells are increased in accordance with the first program operation.

Subsequently, levels of the threshold voltages of the memory cells increased by the first program operation are is detected by performing a verifying operation after the first program operation.

The memory cells may be divided into first memory cells A having a threshold voltage smaller than the first comparing voltage V1, second memory cells B having a threshold voltage between the first comparing voltage V1 and the second comparing voltage V2, third memory cells C having a threshold voltage between the second comparing voltage V2 and the target voltage Vtg, and fourth memory cells D having a threshold voltage higher than the target voltage Vtg in accordance with the verifying operation.

The fourth memory cells D or the third memory cells C may not be existed in accordance with increase degree of the threshold voltage.

To separate the memory cells A to D in the verifying operation, a first verifying operation for comparing the first comparing voltage V1 and the threshold voltage, a second verifying operation for comparing the second comparing voltage V2 and the threshold voltage and a third verifying voltage for comparing the target voltage Vtg and the threshold voltage are performed. Here, the threshold voltages of the first memory cells A are a little changed by the first program operation, i.e. the first memory cells A are memory cells corresponding to slow program velocity. The threshold voltages of the fourth memory cells D are considerably changed by the first program operation, i.e., the fourth memory cells D are memory cells corresponding rapid program velocity.

Then, a second program operation is performed on the memory cells A, B and C having the threshold voltage smaller than the target voltage Vtg.

Figure 2C:
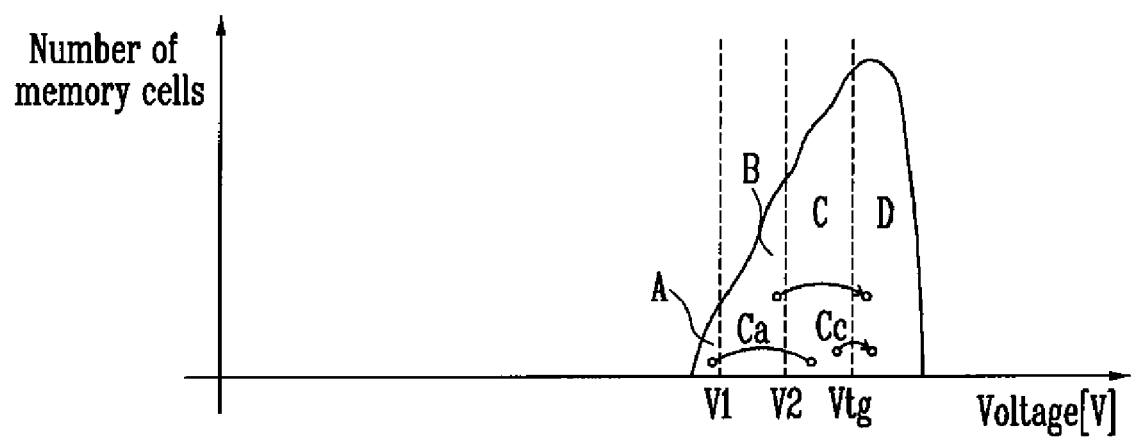

Referring to FIG. 2C and FIG. 3, the second program operation is performed on the memory cells A, B and C having the threshold voltage smaller than the target voltage Vtg after the verifying operation is performed.

The second program operation includes applying a program voltage having a level higher than the program voltage applied to the word line WL0 in the first program operation.

It is desirable that the program voltage in the program operation through the ISPP method is changed in the range of 14V to 22V, wherein an increase in the value of the program voltage is 0.5V to 2V.

On the other hand, width of the threshold voltage distribution in the second program operation is adjusted in accordance with level of the threshold voltages of the memory cells Ca to Cc.

For example, the second program operation changes, i.e. increases highest, the threshold voltage of the first memory cell Ca having the lowest threshold voltage, and changes smallest, the threshold voltage of the third memory cell Cc having highest threshold voltage.

No program operation is performed on the memory cell having the threshold voltage higher than the target voltage Vtg. Here, a program prohibition voltage is applied to a bit line connected electrically to the memory cell having the threshold voltage higher than the target voltage Vtg.

A channel boosting is generated in a bulk of the memory cell having the threshold voltage higher than the target voltage Vtg in accordance with the applied program prohibition voltage, and so voltage difference of a corresponding word line and the bulk becomes low. As a result, the program operation is not performed about the memory cell. This is well-known, and thus any further description about the above operation will be omitted.

Particularly, the first bit line voltage VBL1 having a lowest voltage level is applied to a bit line coupled to a cell string having the first memory cell Ca, and the third bit line voltage VBL3 having highest level is provided to a bit line coupled to a cell string having the third memory cell Cc. Here, the first bit line voltage VBL1 may be 0V, and the third bit line voltage VBL3 may be 0.1V to 2.0V. The second bit line voltage VBL2 is set as a voltage between the first bit line voltage VBL1 and the third bit line voltage VBL3, e.g. may be set as intermediate value of the is bit line voltages VBL1 and VBL3.

Table 1 shows threshold voltage changed in accordance with a voltage applied to the bit line in the program operation through the ISPP method in which an incremental value of the program voltage is set as 0.3V.

TABLE 1

| Bit line voltage [V] | Change value of the threshold voltage [V] |
|---|---|
| 0.40 V | 0.125 V |
| 0.80 V | 0.067 V |
| 1.20 V | 0.034 V |
| 1.60 V | 0.017 V |
| 2.00 V | 0.008 V |

Referring to Table 1, a change value of the threshold voltage of the memory cell is reduced accordingly as the voltage applied to the bit line in the program operation is increased. This is because the voltage difference of the word line and the bulk becomes lower according as voltage of the bit line is increased.

Accordingly, to adjust width of the threshold voltage distributions of the memory cells Ca to Cc in accordance with the above phenomenon, the first bit line voltage VBL1 of 0V is applied to the first bit line, the second bit line voltage VBL2 of 0.4V is to provided to the second bit line, and the third bit line voltage VBL3 of 0.8V is applied to the third bit line.

The above voltage setting may be changed. However, it is desirable that the first bit line voltage VBL1 is smallest voltage and the third bit line voltage VBL3 is highest voltage.

In case that the second program operation applies the above bit line voltages VBL1 to VBL3 to the bit lines, the threshold voltage of the first memory cell Ca, whose threshold voltage is smaller than the target voltage Vtg, is most increased; and the threshold voltage of the third memory cell Cc, whose threshold voltage is a little smaller than the target voltage Vtg, is least augmented.

Accordingly, though the threshold voltage of the third memory cell Cc is higher than the target voltage Vtg, the threshold voltage of the third memory cell Cc may not be greatly increased.

In addition, since the bit line voltage is set to most increase the threshold voltage of the first memory cell Ca having lowest threshold voltage, number of the program operations performed in the program operation through the ISPP method may be minimized. That is, time for the program operation through the ISPP method may be minimized.

Figure 2D:
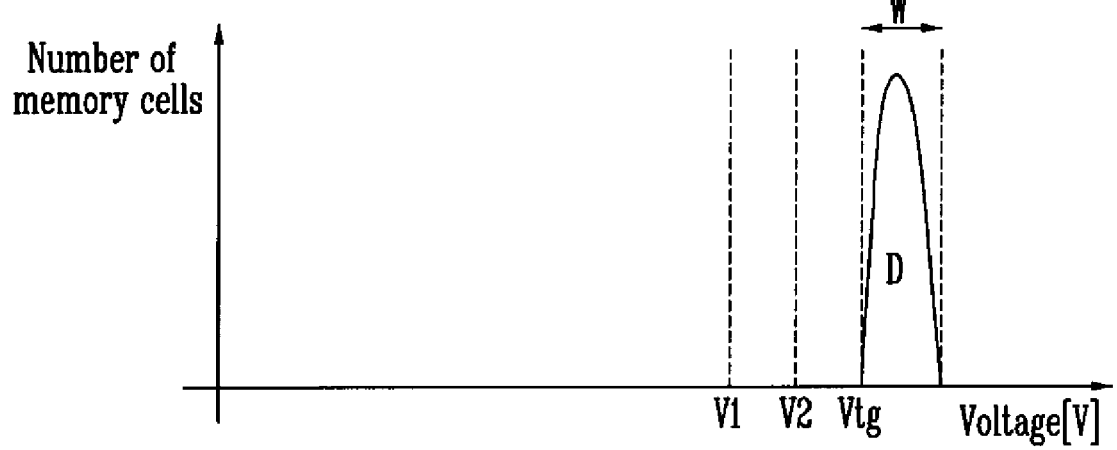

In FIG. 2D, the verifying operation, which compares the threshold voltages of the memory cells changed by the second program operation with the first comparing voltage V1, is again performed, using second comparing voltage V2 and the target voltage Vtg.

In case that the memory cell having a threshold is voltage smaller than the target voltage Vtg exists in accordance with the verifying operation, the program voltage is increased by a predetermined level according to FIG. 2C. Then, a third program operation is performed by using the increased program voltage.

The program operation and the verifying operation described in FIG. 2C are repeatedly performed until threshold voltages of every memory cell is higher than the target voltage Vtg.

In case the above program operation is performed using the ISPP method, width W of the threshold voltage distribution of the programmed memory cells may be more narrowed.

In the above description, two comparing voltages V1 and V2 smaller than the target voltage Vtg are set and three bit line voltages VBL1 to VBL3 having different levels are applied to the bit lines. However, in case that above two comparing voltages are set and above three bit line voltages having different levels are applied to corresponding bit lines, width of threshold voltage distribution of programmed memory cells may be more narrowed.

Any reference in this specification to "one embodiment," "an embodiment," "exemplary embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of operating a flash memory device, the method comprising:
    performing a first program operation on memory cells of the flash memory device;
    performing a verifying operation that separates the memory cells in accordance with levels of threshold voltages of the memory cells; and
    performing a second program operation on the memory cells so that the threshold voltages of the memory cells are increased inversely proportional to the levels thereof.

2. The method of claim 1, wherein a threshold voltage of a memory cell having a threshold voltage higher than a target voltage is not increased in the second program operation.

3. The method of claim 1, wherein a second program voltage, higher than a first program voltage applied in the first program operation, is provided in the second program operation.

4. The method of claim 3, wherein the second program voltage is in the range of approximately 14V to approximately 22V.

5. The method of claim 4, wherein the first program voltage is increased by about 0.1V to about 2.0V.

6. The method of claim 1, wherein the verifying operation and the second program operation are repeatedly performed with an increase in step program voltage until the threshold voltages of every memory cell are higher than the target voltage.

7. A method of operating a flash memory device, the method comprising:
    performing a first program operation on memory cells of the flash memory device;
    performing a verifying operation that separates the memory cells into first memory cells, second memory cells, third memory cells and fourth memory cells, wherein
    threshold voltages of the first memory cells are higher than a target voltage,
    threshold voltages of the second memory cells are lower than the target voltage and higher than a first comparing voltage, threshold voltages of the third memory cells are lower than the first comparing voltage and higher than a second comparing voltage, and
    threshold voltages of the fourth memory cells are lower than the second comparing voltage; and
    performing a second program operation on the second memory cells, the third memory cells, and the fourth memory cells so that the threshold voltages of the second memory cells to the fourth memory cells are increased, and the increments of the threshold voltages are in inversely proportional to levels thereof.

8. The method of claim 7, wherein a threshold voltage of the memory cell having a threshold voltage higher than the target voltage is not increased in the second program operation.

9. The method of claim 7, wherein a second program voltage, higher than a first program voltage applied in the first program operation, is provided in the second program operation.

10. The method of claim 9, wherein the program voltage is increased to be within the range of approximately 14V to approximately 22V.

11. The method of claim 10, wherein the program voltage is increased by about 0.1V to about 2.0V.

12. The method of claim 7, wherein a voltage difference between the first comparing voltage and the target voltage is about 0.2V to about 0.5V.

13. The method of claim 12, wherein the second comparing voltage is set at an intermediate level between the first comparing voltage and the target voltage.

14. The method of claim 7, wherein a program prohibition voltage is applied to a bit line connected electrically to the first memory cell in the second program operation so that program of the first memory cell is not performed.

15. The method of claim 7, wherein the verifying operation and the second program operation are repeatedly performed with a step increase in program voltage until the threshold voltages of every memory cell are higher than the target voltage.

16. A method of operating a flash memory device, the method comprising:
   performing a first program operation on memory cells of the flash memory device;
   performing a verifying operation that separates the memory cells into first memory cells, second memory cells, third memory cells and fourth memory cells, wherein
   threshold voltages of the first memory cells are higher than a target voltage,
   threshold voltages of the second memory cells are lower than the target voltage and higher than a first comparing voltage,
   threshold voltages of the third memory cells are lower than the first comparing voltage and higher than a second comparing voltage, and
   threshold voltages of the fourth memory cells are lower than the second comparing voltage; and
   performing a second program operation by applying a first bit line voltage, a second bit line voltage, a third bit line voltage, and a fourth bit line voltage to a first bit line, a second bit line, a third bit line, and a fourth bit line electrically connected to the first memory cells, the second memory cells, the third memory cells and the fourth memory cells.

17. The method of claim 16, wherein a threshold voltage of the memory cell having the threshold voltage higher than the target voltage is not increased in the second program operation.

18. The method of claim 16, wherein a second program voltage higher than a first program voltage applied in the first program operation is provided in the second program operation.

19. The method of claim 18, wherein the increased program voltage is in the range of approximately 14V to approximately 22V.

20. The method of claim 19, wherein the program voltage is increased by about 0.1V to about 2.0V.

21. The method of claim 16, wherein a difference between the first comparing voltage and the target voltage is about 0.2V to about 0.5V.

22. The method of claim 21, wherein the second comparing voltage is set at an intermediate level between the first comparing voltage and the target voltage.

23. The method of claim 16, wherein the first bit line voltage, the second bit line voltage, the third bit line voltage, and the fourth bit line voltage is applied to the first bit line, the second bit line, the second bit line, and the fourth bit line, respectively, with levels proportionate to levels of the threshold voltages of the first, second, third, and fourth memory cells.

24. The method of claim 16, wherein the third bit line voltage is applied with an intermediate level of the second bit line voltage and the fourth bit line voltage.

25. The method of claim 16, wherein a program prohibition voltage is applied to a bit line connected electrically to the first memory cell in the second program operation so that program of the first memory cell is not performed.

26. The method of claim 16, wherein the verifying operation and the second program operation are repeatedly performed, increasing in step a program voltage until the threshold voltages of every memory cell are higher than the target voltage.

* * * * *